(12) United States Patent
Molas et al.

(10) Patent No.: US 9,209,391 B2
(45) Date of Patent: Dec. 8, 2015

(54) ELECTRONIC MEMORY DEVICE HAVING AN ELECTRODE MADE OF A SOLUBLE MATERIAL

(71) Applicant: COMMISSARIAT À L'ÉNERGIE ATOMIQUE ET AUX ÉNERGIES ALTERNATIVES, Paris (FR)

(72) Inventors: Gabriel Molas, Grenoble (FR); Jean-François Nodin, Quaix en Chartreuse (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/091,623

(22) Filed: Nov. 27, 2013

(65) Prior Publication Data

US 2014/0145141 A1    May 29, 2014

(30) Foreign Application Priority Data

Nov. 27, 2012  (FR) .................................... 12 61260

(51) Int. Cl.
*H01L 47/00* (2006.01)
*H01L 45/00* (2006.01)

(52) U.S. Cl.
CPC .......... *H01L 45/1253* (2013.01); *H01L 45/085* (2013.01); *H01L 45/1233* (2013.01); *H01L 45/1246* (2013.01); *H01L 45/1266* (2013.01); *H01L 45/1273* (2013.01); *H01L 45/142* (2013.01); *H01L 45/146* (2013.01); *H01L 45/16* (2013.01); *H01L 45/1683* (2013.01)

(58) Field of Classification Search
CPC ........................................................ H01L 45/00
USPC ................................................ 257/4; 438/707
See application file for complete search history.

(56) References Cited

U.S. PATENT DOCUMENTS

| 8,022,547 | B2 | 9/2011 | Vaithyanathan |
| 8,035,096 | B2 * | 10/2011 | Iguchi .............................. 257/4 |
| 8,313,979 | B2 * | 11/2012 | Lung et al. .................... 438/102 |

(Continued)

FOREIGN PATENT DOCUMENTS

EP    2 141 753    1/2010

OTHER PUBLICATIONS

French Search Report as issued for French Patent Application No. 1261260, dated Jul. 23, 2013.

*Primary Examiner* — Caleb Henry
(74) *Attorney, Agent, or Firm* — Pillsbury Winthrop Shaw Pittman LLP

(57) ABSTRACT

An electronic device includes a first electrode made of an inert material; a second electrode made of a soluble material; a solid electrolyte made of an ion-conductive material, wherein the first and second electrodes are in contact respectively with one of the faces of the electrolyte, either side of the electrolyte, wherein the second electrode supplies mobile ions flowing in the electrolyte towards the first electrode, to form a conductive filament when a voltage is applied between the first and second electrodes. The second electrode is a confinement electrode that includes an end surface in contact with the electrolyte which is less than the available surface of the electrolyte, such that confinement of the contact area of the confinement electrode on the solid electrolyte is obtained.

13 Claims, 4 Drawing Sheets

(56) References Cited

U.S. PATENT DOCUMENTS

| | | | |
|---|---|---|---|
| 8,598,562 B2 * | 12/2013 | Sills | 257/4 |
| 2005/0286211 A1 * | 12/2005 | Pinnow et al. | 361/523 |
| 2007/0285148 A1 * | 12/2007 | Sakamoto et al. | 327/365 |
| 2008/0314738 A1 | 12/2008 | Gopalakrishnan | |
| 2010/0193762 A1 * | 8/2010 | Hsieh et al. | 257/4 |
| 2010/0273305 A1 * | 10/2010 | Klein | 438/382 |
| 2011/0120856 A1 | 5/2011 | Karg | |
| 2011/0194339 A1 * | 8/2011 | Kozicki | 365/163 |
| 2011/0217818 A1 * | 9/2011 | Lung et al. | 438/238 |
| 2012/0267597 A1 | 10/2012 | Lung | |
| 2013/0056699 A1 * | 3/2013 | Lung et al. | 257/2 |
| 2014/0166970 A1 * | 6/2014 | Shen et al. | 257/4 |

\* cited by examiner

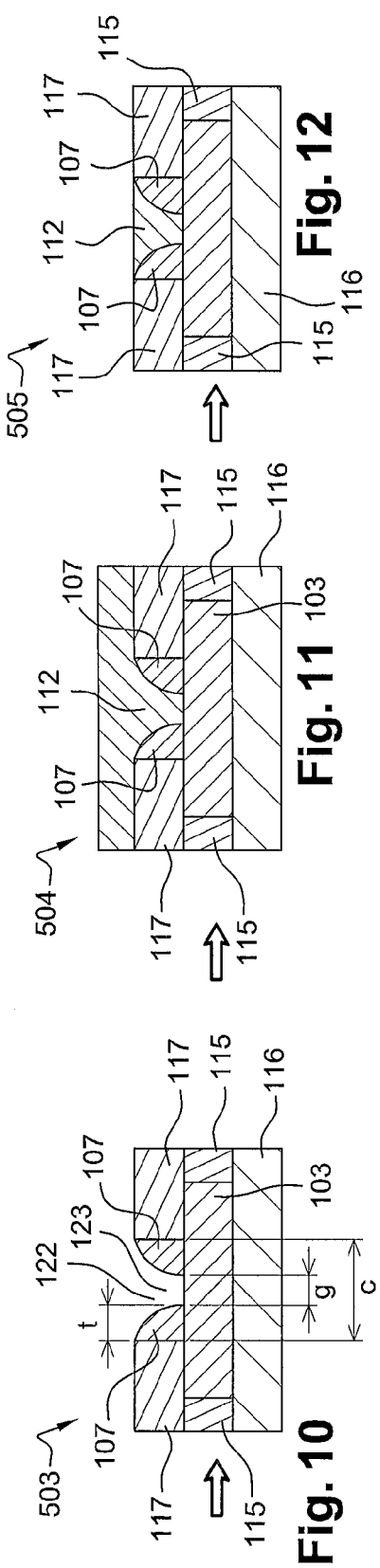

ELECTRONIC MEMORY DEVICE HAVING AN ELECTRODE MADE OF A SOLUBLE MATERIAL

CROSS REFERENCE TO RELATED APPLICATIONS

This application claims the benefit of priority from French Patent Application No. 1261260 filed on Nov. 27, 2012, the entire content of which is incorporated herein by reference.

FIELD

The present invention relates to an electronic memory device; the invention relates more particularly to the field of rewritable memories, and more specifically that of CBRAM or "Conductive Bridging RAM" memories.

BACKGROUND

Depending on the applications and the desired performance specifications, different types of memories are used.

Memories of the SRAM, or static RAM, type, thus have ultra-rapid write times, required for example for computations by a microprocessor. The major difficulty with these memories is that they are volatile and that the relatively large size of the memory point does not enable a large storage capacity to be obtained in a reasonable volume.

Memories of the DRAM, or dynamic RAM, type store electrical charges in capacitors, providing a large storage capacity. However, these memories have higher write times (several tens of nanoseconds) than those of SRAM-type memories, and are also volatile, the information retention time being of around some tens of milliseconds.

Conversely, in the case of applications requiring storage of information even when power is off, solid-state memory devices which preserve information without power are also known: these devices are called non-volatile memories. For many years, various technological solutions have thus been developed, and have led to the availability of non-volatile memories which can be written and erased electrically. The following may for example be cited:

EPROMs ("Erasable Programmable Read Only Memories"), the content of which may be written electrically, but which must be exposed to UV radiation to erase the recorded data;

EEPROMs ("Electrically Erasable Programmable ROMs"), the content of which may be written and erased electrically, but which require larger semiconductor areas for their manufacture than EPROM memories, and which are therefore more costly to manufacture.

Since both solutions mentioned above have limits to their application, manufacturers have worked on finding an ideal non-volatile memory, which can combine the following characteristics: electrical writing and erasing, high density and low cost per bit, random access, short write and read times, satisfactory life expectancy, but also low consumption and low power voltage.

Many non-volatile memories also exist, called Flash memories, which do not have the shortcomings of the EPROM or EEPROM memories mentioned above. A Flash memory is formed from multiple memory cells which may be programmed electrically on an individual basis, where a large number of cells, called a block, sector or page, can be erased simultaneously and electrically. Flash memories combine both the benefit of EPROM memories in terms of integration density, and the benefit of EEPROM memories in terms of electrical erasure.

In addition, the durability and low electrical consumption of Flash memories make them interesting for many applications: digital cameras, mobile telephones, printers, personal assistants, laptop computers, or portable acoustic reading and recording devices, USB flash drives, etc. In addition, Flash memories have no mechanical elements, giving them quite high impact resistance. In the "all-digital" era these products have become very widely used, leading to an explosion of the Flash memory market.

Most commercially available non-volatile Flash memories use charge storage as the data encoding basis. In practice, a charge-trapping layer (generally polysilicon, or a dielectric such as SiN) is encapsulated between two dielectrics in the gate stack of a MOS transistor. The presence or absence of a charge in this medium modifies the condition of the MOS transistor, and enables the state of the memory to be encoded.

More recently, other types of rewritable non-volatile memories have appeared to reduce the voltages and programming times of Flash memories; in particular FeRAM or "Ferroelectric RAM" memories, based on polarisation switching, or MRAM or "Magnetic RAM memories, which use the direction of the residual magnetic field in the active material, may be mentioned. However, FeRAM and MRAM memories present difficulties which limit their scaling-down.

To overcome these difficulties variable-resistance memories (called RRAM or "Resistive RAM" memories) are known; these are now the subject of great attention. Memories of the resistive type may have at least two "off" or "on" states, corresponding to the transition from a resistive state ("OFF" state) to a less resistive state ("ON" state).

Three types of resistive memory may be distinguished: memories using a thermochemical mechanism, memories based on a change of valency, and memories based on electrochemical metallisation.

The latter category may be based on active materials such as ion-conductive materials, which can be referred to as CBRAM or "Conductive Bridging RAM" materials (or PMC materials, for Programmable Metallization Cell) and the operation of which is based on reversible formation and rupture of a conductive filament in a solid electrolyte, by dissolution of a soluble electrode. These memories are extremely promising due to their low programming voltages (of the order of one Volt), their short programming times (<1 μs), their low consumption and their low integration cost. In addition, these memories may be integrated in the metallisation levels of the logic of the circuit ("above IC"), enabling the density to be increased. From the architecture standpoint these memories generally require a selection device, which may, for example, be a transistor or a diode.

The operation of CBRAM-type devices is based on the formation, within a solid electrolyte, of one or more metal filaments (also called "dendrites") between two electrodes, when appropriate respective potentials are applied to these electrodes. Formation of the filament enables a given electrical conduction to be obtained between the two electrodes. By modifying the respective potentials applied to the electrodes the distribution of the filament may be modified, and by this the electrical conduction between the two electrodes may be modified. By reversing, for example, the potential between the electrodes, the metal filament may be made to disappear or to be reduced, so as to eliminate or substantially reduce the electrical conduction due to the presence of the filament.

CERAM devices may thus have a two-state operation: a state called "ON" and a state called "OFF", and by this means may act as memory cells.

FIG. 1 represents a schematic diagram of an electronic device 1 of the CERAM type.

This device 1 is formed by a stack of the Metal/Ionic Conductor/Metal type. It comprises a solid electrolyte 2, for example made of doped chalcogenide, such as GeS, positioned between a lower electrode 3, for example made of Pt, forming an inert cathode, and an upper electrode 4 comprising a portion of ionisable metal, for example made of Ag or Cu, i.e. a portion of metal which is able easily to form metal ions (in this case, Ag+ or Cu2+ ions), and forming an anode. Device 1 represented in FIG. 1 typically forms a memory point, i.e. a unit memory cell, of a memory comprising a large number of these memory devices: in this case the electrolyte is generally integrated in a "contact point", between the two electrodes, which are organised in line in mutually perpendicular directions.

The memory state of a CBRAM memory device results from the difference of electrical resistivity between two states: ON and OFF. In the OFF state the metal ions (for example, in this case, Ag+ ions for a soluble electrode which is in Ag) originating from the ionisable metal portion are dispersed throughout the solid electrolyte. No electrical contact is thus made between the anode and the cathode, i.e. between the ionisable metal portion and the lower electrode. The solid electrolyte forms an electrically insulating area of high resistivity between the anode and the cathode.

When a positive potential V is applied to upper soluble electrode (anode) 4, an oxidation-reduction reaction takes place at this electrode, creating mobile ions 5 (FIG. 2).

In the case of a silver electrode 4, the following reaction takes place:

$$Ag \rightarrow Ag^+ + e^-.$$

To accomplish this, potential V applied to soluble electrode 4 should be sufficient for the redox reaction to take place.

Ions 5 then move in electrolyte 2 under the effect of the applied electrical field. The speed of movement depends on the mobility of the ion in the electrolyte in question, which guides the choice of the soluble electrode/electrolyte pair (examples: Ag/GeS; Cu/SiO2, etc.). The ions' speeds are of the order of one nm/ns.

When they arrive at inert electrode 3 (the cathode), ions 5 are reduced through the presence of electrons supplied by the electrode, leading to the growth of a metal filament 6 according to the following reaction:

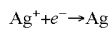

$$Ag^+ + e^- \rightarrow Ag$$

This filament preferentially grows in the direction of soluble electrode 4.

Memory 1 then changes to the ON state (FIG. 3) when filament 6 allows contact between the two electrodes 3 and 4, making the stack conductive. This phase is called the SET of the memory.

To change to the OFF state (RESET phase of the memory), a negative voltage V is applied to upper electrode 4, leading to the dissolution of the conductive filament. To explain this dissolution, thermal (heating) and oxidation-reduction mechanisms are generally invoked.

Many studies relate to these CBRAM memories in order to improve their reliability and their performance characteristics. Among the proposed solutions the following may in particular be cited: engineering of the electrolyte (addition of doping agents, choice of new materials, annealing, UV processing, etc.), engineering of the soluble electrode and of the inert electrode, or the addition of interface(s) between the electrodes and the electrolyte.

To reduce the dimensions of CERAM memories, an architecture based on ring-shaped conductive electrodes was proposed in U.S. Pat. No. 8,022,547. This solution enables the dimensions of the active area to be reduced, without using critical photolithography steps.

However, the known solutions mentioned above have certain difficulties.

One of the difficulties of filament memories such as CBRAMs thus relates to the high dispersion of certain electrical characteristics. In particular, high dispersions of the SET and RESET voltages are measured in the memory matrices, but also within a given device, during cycling of the cell (life expectancy measurement). This dispersion is important for the reliability of these devices, and limits their large-scale integration. These limitations are also found in memories of the OXRRAM type (oxide-based resistive memories), in which the change of resistive state is related to the formation of a filament of oxygen vacancies. One of the origins invoked to explain this dispersion relates to the difficulty in controlling the size and position of the filament, which may vary from one cycle to the next in the memory cell.

Document US2011/0120856 describes a CBRAM memory enabling the shape of the filament to be controlled; to accomplish this, the electrolyte has an asymmetrical shape, such that the contact section of the electrolyte with the soluble electrode is less than the contact section of the electrolyte with the inert electrode. The shape of the spacers surrounding the electrolyte, combined with the shape of the electrolyte, enable the active region, and therefore the shape of the conductive filament, to be clearly defined.

However, this solution also has certain drawbacks.

SUMMARY

The reduction of the size of the electrolyte may thus lead to a degradation of performance when the size of the electrolyte in the area of the soluble electrode is close or equal to that of the filament which it is desired to create. For example, when erasing there is then little available space in the electrolyte to dissolve the formed filament.

An aspect of the invention seeks to remedy the drawbacks of the state of the art by proposing an electronic device with improved electrical characteristics and cyclability.

In this context, in an embodiment of the present invention, there is provided an electronic device comprising:
- a first electrode made of an inert material;
- a second electrode made of a soluble material;
- a solid electrolyte made of an ion-conductive material, where the first and second electrodes are in contact respectively with one of the faces of the electrolyte, either side of the electrolyte, where the second electrode is able to supply mobile ions flowing in the electrolyte towards the first electrode, in order to form a conductive filament between the first electrode and the second electrode when a voltage is applied between the first and second electrodes;

where the second electrode made of soluble material is a confinement electrode, where the confinement electrode comprises an end surface in contact with the electrolyte which is less than the available surface of the electrolyte, such that confinement of the contact area of the confinement electrode on the solid electrolyte is obtained.

The term "conductive filament" is understood to mean at least one nanowire or dendrite (for example metallic) formed by the growth of ions (for example metal ions) within the electrolyte.

By virtue of an embodiment of the invention at least one of the two electrodes is subject to confinement; this confinement enables the formation of the conductive filament to be controlled. The smaller the contact surface, the more the filament will be guided in its growth, and therefore the more the electrical characteristics will be reproducible. In an embodiment, the confinement electrode is the electrode made of soluble material, such that the volume of the ion donor material is reduced. This confinement enables the size and position of the filament to be controlled, while guiding it in its growth during the SET operation of the CBRAM memory. Confinement of the upper electrode enables an electrical field peak to be generated during the SET operation, causing preferential vertical growth of the filament. In other words, a point effect on the confinement electrode leads to a local increase of the electrical field during the SET operation, enabling the filament to be guided during its formation, and therefore the size and position dispersions of the filament to be reduced.

The device according to an embodiment of the invention may also have one or more of the characteristics below, considered individually, or in all technically possible combinations:

the section of the confinement electrode measured parallel to the contact plane of the electrolyte with the confinement electrode continuously grows from the contact plane over at least part of the height of the confinement electrode;

the volume of the electrolyte is chosen such that the surface of the first end of the electrolyte in contact with the first electrode is strictly less than the surface of the second end of the electrolyte opposite the first end; according to this embodiment, both the electrolyte and one of the electrodes are confined (for example by producing two successive cavities in dielectric materials which will receive respectively the electrolyte and the electrode). This double confinement is still more beneficial since it enables the size and position of the filament to be controlled more effectively. An asymmetrical volume is beneficially used for the electrolyte, so as to benefit from a reduced volume on the side of the inert electrode, and from a larger volume on the side of the soluble electrode. It will be noted that this configuration of the confinement electrolyte is precisely the reverse of the configuration shown in document US2011/0120856. In other words, in this case the shape of the electrolyte is beneficially adjusted in order to reduce the contact surface with the inert electrode, whilst retaining a sufficient volume of electrolyte, notably for erasure.

By choosing such a configuration, confinement of the electrolyte in the area of the inert electrode is used, enabling the formation of the conductive filament to be controlled (i.e. the smaller the volume of electrolyte, the more the filament will be guided in its growth, and therefore the more the electrical characteristics will be reproducible), but at the same time a sufficient volume of electrolyte is also retained (notably in the soluble electrode) in order not to degrade the performance characteristics of the device (the size of the electrolyte remains greater than that of the filament in the area of the soluble electrode); thus, when erasing, sufficient available space remains on approaching the soluble electrode in the electrolyte to dissolve the formed filament.

the section of the electrolyte measured parallel to the contact plane of the electrolyte with the first electrode grows continuously from the contact plane over at least part of the height of the electrolyte;

the electrolyte has a first portion of constant section in contact with the first electrode followed by a second portion of constant section, where the constant section of the first portion is less than the constant section of the second portion, and where the constant sections are measured parallel to the contact planes of the electrolyte with the first and second electrodes;

the device according to an embodiment of the invention comprises an insulating device or insulator surrounding the electrolyte over at least part of its height;

the device according to an embodiment of the invention comprises an insulating device or insulator surrounding the confinement electrode over at least part of its height;

the solid electrolyte is manufactured from a chalcogenide material such as a selenide or a telluride, from certain oxides such as $SiO_2$, $HfO_2$, $Ta_2O_5$, $TiO_2$, GdOx, CuOx, WOx, or from sulphides such as $GeS_x$, $Cu_xS$ or AgS.

Another aspect of the present invention is a method of manufacture of the device according to an embodiment the present invention comprising:

producing an aperture in an insulating material, where the aperture has the shape of the confinement electrode;

filling the aperture by a material forming the electrode.

According to a first embodiment, the aperture is obtained by anisotropic etching of the insulating material.

According to a second embodiment, the aperture is obtained by transferring a pattern of resin subject to creep in the insulating material.

Another aspect of the present invention is a method for manufacturing the device according to an embodiment of the present invention comprising:

producing of a first aperture in an insulating material, where the first aperture has the shape of the electrolyte;

filling the first aperture by a material forming the electrolyte;

producing a second aperture in an insulating material, where the second aperture has the shape of the confinement electrode;

filling the second aperture by a material forming the electrode.

BRIEF DESCRIPTION OF THE DRAWINGS

Other characteristics and benefits of the invention will become clear from the description which is given of it below, by way of example and non-restrictively, with reference to the appended figures, in which:

FIGS. 8 to 15 illustrate an example embodiment of a method of manufacture of the device of FIG. 4;

In all the figures the common elements have the same reference numbers.

DETAILED DESCRIPTION

Figure 1:
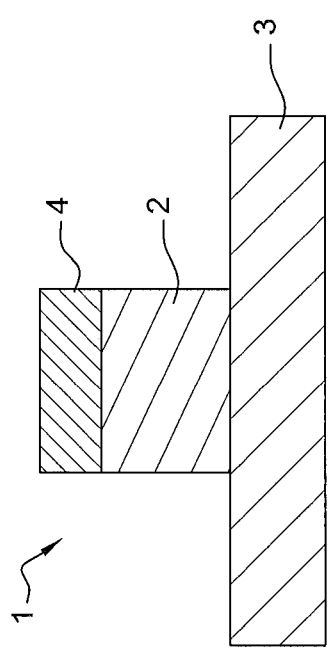
FIGS. 1 to 3 represent schematically an ion conduction device of the CBRAM type according to the state of the art.
Figure 3:
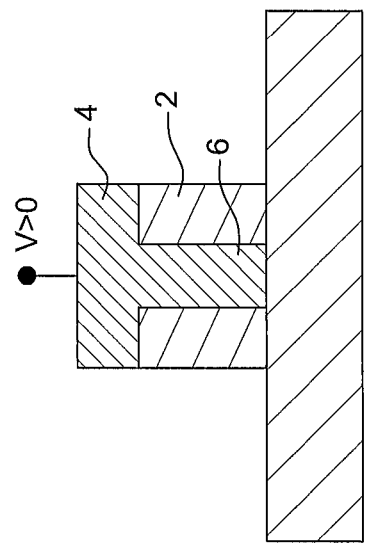
Figure 2:
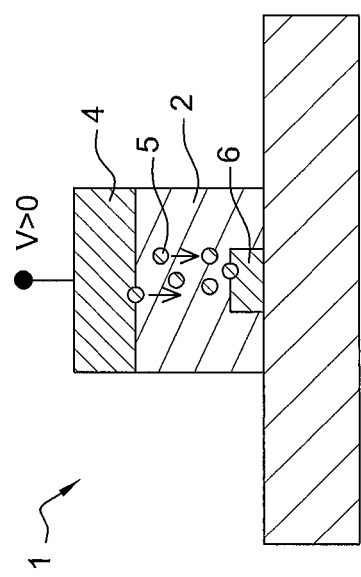

FIGS. 1 to 3 have previously been described with reference to the state of the art.

Figure 4:
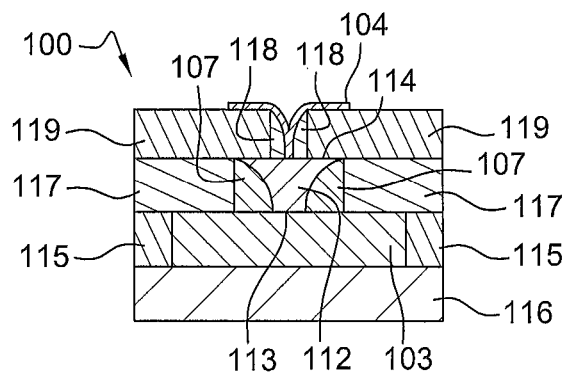
FIG. 4 represents schematically an electronic device according to a first embodiment of the invention.

FIG. 4 illustrates a first embodiment of a device 100 according to the invention.

Device 100 is formed by a stack of the Metal/Ionic Conductor/Metal type.

Device 100 comprises a solid electrolyte 112, for example made of doped chalcogenide, such as GeS, positioned between a lower inert electrode 103, for example made of Pt, forming an inert cathode, and an upper electrode 104 comprising a portion of ionisable metal, for example made of Ag, i.e. a portion of metal which is able easily to form metal ions (in this case, Ag+ ions), and forming an anode. This device 100 also comprises lateral dielectric portions 107 positioned around electrolyte 112. These dielectric spacers 107 are themselves surrounded by dielectric portions 117.

Inert electrode 103 is isolated laterally (for example by dielectric spacers 115) and rests on a metal line 116. This metal line 116 may, for example, form part of an access line (line of bits or line of words) if resistive memory device 100 according to the invention is integrated in an architecture of the "cross-bar" type.

A first solution to control the formation of the conductive filament within the electrolyte would be to reduce the size of the electrolyte uniformly. The smaller the volume of the electrolyte, the more the filament will be guided in its growth, and therefore the more the electrical characteristics will be reproducible. Formation of the filament is constrained by the small size of the electrolyte, close to the size of the filament. However, reduction of the size of the electrolyte may lead to a degradation of performance when the size of the electrolyte is close or equal to that of the filament which it is desired to create. For example, in the case of an erasure operation, there is little available space in the electrolyte to dissolve the formed filament. The shape of electrolyte 112 is beneficially chosen to reduce the contact surface 113 between electrolyte 112 and inert electrode 103, while retaining a sufficient volume of electrolyte.

In other words, the volume of electrolyte 112 is asymmetrical, and chosen such that contact surface 113 of the electrolyte with inert electrode 103 is strictly less than surface 114 of electrolyte 112 located on the side of soluble electrode 104.

The sides of electrolyte 112 are in this case concave and rounded, with a section measured parallel to the plane of the layers of the stack (and therefore parallel to the contact planes of electrodes 103 and 104) which grows continuously from contact surface 113 of electrolyte 112 with inert electrode 103 as far as surface 114 of electrolyte 112 on the side of soluble electrode 104. The shape is given purely illustratively and in no way restrictively.

Soluble electrode 104 is in this case an electrode of which the end in contact with surface 114 of electrolyte 112 is small. In other words, the surface of the end of soluble electrode 104 in contact with electrolyte 112 is less than the available surface of electrolyte 112, such that a confinement of the contact area of soluble electrode 104 on solid electrolyte 112 is obtained. As with electrolyte 112 the sides of soluble electrode 104 are concave and rounded. The shape is given purely illustratively and in no way restrictively.

Device 100 also comprises lateral dielectric portions 118 positioned around soluble electrode 104. These dielectric spacers 118 are themselves surrounded by dielectric portions 119.

The confinement of upper soluble electrode 104 allows the formation of the conductive filament to be controlled. The smaller contact surface 113, the more the filament will be guided in its growth, and therefore the more the electrical characteristics will be reproducible.

According to this embodiment, both electrolyte 112 and upper soluble electrode 104 are confined. This double confinement enables the size and position of the filament to be controlled, while guiding it in its growth during the SET operation of the CERAM memory. Confinement of the electrolyte enables the available space for the filament to be reduced (and therefore the filament to be guided), and confinement of the upper electrode enables an electric field peak to be generated during the SET operation, leading to vertical preferential growth of the filament.

By choosing such a geometry for electrolyte 112 and soluble electrode 104, CERAM device 100 according to an embodiment of the invention not only enables a localised filament to be obtained, but also a sufficient volume of electrolyte to be kept to facilitate erasure.

The filament is thus guided in its growth through the narrowing of the end of soluble electrode 104 in contact with effective surface 114 of electrolyte 112 and the confinement of contact area 113 of electrolyte 112 with inert electrode 103, the electrical characteristics thus being reproducible.

The memory state of CERAM memory device 100 results from the difference of electrical resistivity between two states: ON and OFF. In the OFF state the metal ions (for example, in this case, Ag+ ions for a soluble electrode which is in Ag) originating from the ionisable metal portion are dispersed throughout solid electrolyte 112. No electrical contact is thus made between soluble electrode 104 and inert electrode 103, i.e. between the portion of ionisable metal and the lower electrode. The solid electrolyte 112 forms an electrically insulating area of high resistivity between the anode 104 and the cathode 103.

When a positive potential V is applied to upper soluble electrode 104, an oxidation-reduction reaction takes place at this electrode, creating mobile ions.

In the case of a silver electrode 104, the following reaction takes place:

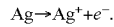

$$Ag \rightarrow Ag^+ + e^-.$$

For this to occur, potential V applied to soluble electrode 104 is greater than the redox potential of electrode 104 in question (generally of the order of several hundred mV).

The fact that electrode 104 is confined leads to a point effect in this electrode, and a local increase of the electrical field created during this SET operation. This very localised increase of the field enables the Ag+ ions to be guided, and therefore enables the formation of the filament to be guided. The Ag+ ions then move in electrolyte 112 under the effect of the applied and localised electrical field. When they arrive at inert electrode 103 the Ag+ ions are reduced through the presence of electrons supplied by the electrode, leading to the growth of a metal filament according to the following reaction:

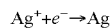

$$Ag^+ + e^- \rightarrow Ag$$

This filament grows in the direction of soluble electrode 104.

Due to the narrowing (or confinement) of electrolyte 112 on approaching inert electrode 103, the Ag+ ions are constrained in their movement, such that formation of the filament is perfectly controlled. This is the initial creation of the filament in the area of inert electrode 103 which is controlled due to the reduced size of contact surface 113 between electrolyte 112 and cathode 103.

Memory 100 then changes to the ON state when the filament allows contact between the two electrodes 103 and 104, making the stack conductive. This phase is called the SET of the memory.

To change from the OFF state (RESET phase of the memory), a negative voltage V is applied to upper electrode 104, leading to the dissolution of the conductive filament in the form of Ag+ ions. Due to device 100 according to an embodiment of the invention and to the flared shape of electrolyte 112, a sufficient volume is retained in the upper portion of the electrolyte (i.e. on the side of soluble electrode 104) towards which the ions are directed during dissolution so as to facilitate erasure, with the ions being redeposited on soluble electrode 104.

Figure 5:
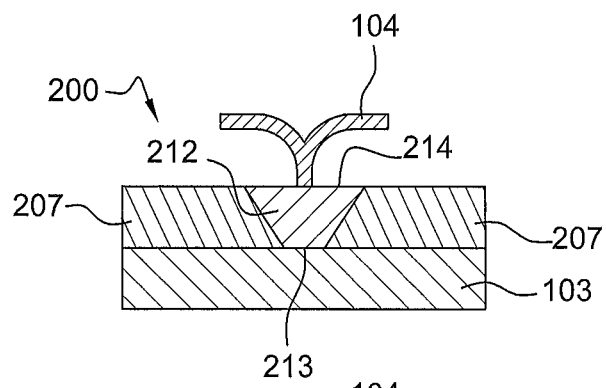
FIGS. 5 to 7 represent schematically three other embodiments of the device according to the invention with different shapes of electrolytes.
Figure 6:
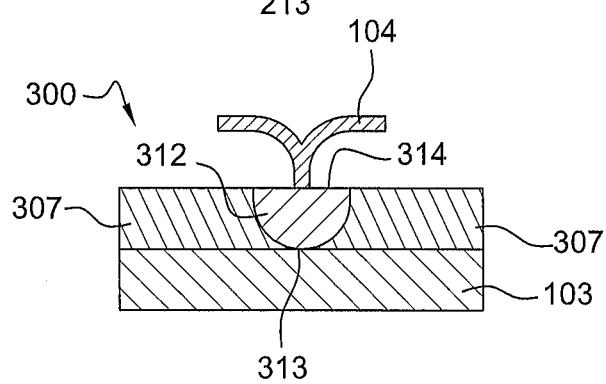
Figure 7:
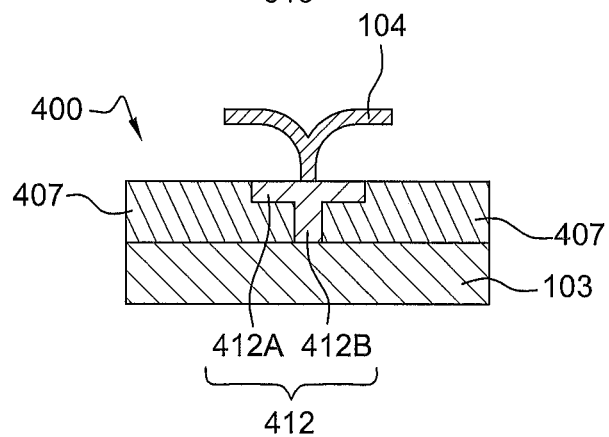

The shape of electrolyte 112 with sides of concave, rounded shape, is given purely illustratively, with the understanding that other electrolyte shapes are perfectly conceivable; three other examples of electrolytes are thus illustrated in FIGS. 5 to 7.

As with electrolyte 112 of device 100, electrolytes 212 and 312, belonging respectively to CERAM devices 200 and 300 of FIGS. 5 and 6, have a shape which is chosen such that the section of the electrolyte measured parallel to the plane of the layers of the stack (and therefore parallel to the contact planes of electrodes 103 and 104) grows continuously from contact surface 213 (respectively 313) of electrolyte 212 (respectively 312) with inert electrode 103 as far as contact surface 214 (respectively 314) of electrolyte 212 (respectively 312) with soluble electrode 104.

Electrolyte 212 has a general globally pyramidal shape, whereas electrolyte 312 has sides of a rounded, convex shape. It remains the case that the most efficient form is the one which combines a small electrolyte surface on the side of the inert electrode with a high volume of electrolyte on the side of the soluble electrode.

According to another embodiment illustrated in FIG. 7, CBRAM device 400 according to an embodiment of the invention comprises an electrolyte 412 having a first portion 412B of constant section in contact with inert electrode 103, and a second portion 412A of constant section in contact with soluble electrode 104, where the sections are measured parallel to the plane of the layers of the stack (and therefore parallel to the contact planes of electrodes 103 and 104). The constant section of first portion 412B is chosen to be smaller than the constant section of second portion 412A.

The shapes of the electrolytes (cf. in particular, FIGS. 4, 5 and 6) may be obtained by production of spacers in a via of relaxed dimensions (and which is therefore compatible with a standard technology). The shape of the obtained spacer depends on the etching conditions (known to those skilled in the art), which enable the slope of the electrolyte in the dielectric to be controlled.

The shapes of the electrolytes (cf. in particular, FIG. 7) may also be obtained by production of successive steps of lithography, or by self-aligned etching of materials showing a different etching speed in order to increase the volume of electrolyte in the area of the soluble electrode, while retaining a small contact area between the electrolyte and the inert electrode.

It will be noted that in each of the cases dielectric spacers 107 (respectively 207, 307 and 407) and 118 have sides which match the respective sides of the electrolyte and of the confinement electrode. In other words, there is no discontinuity of material. In practice, the electrolyte and the confinement electrode are each deposited in the cavity formed by their respective spacers.

FIGS. 8 to 15 illustrate the main steps of a method of manufacture of device 100 of FIG. 4.

According to step 501 represented in FIG. 8, a metal line 116 is first produced, for example on a Si substrate or on MOS transistors of an unrepresented lower logic level. As mentioned above, this metal line may serve as a line of words or bits in a matrix structure of the "cross-bar" type, incorporating several memory devices according to an embodiment of the invention. This line 116 may be produced in a known manner by a step of etching after photolithography, and formed, for example, from Cu or an AlCu or AlSi alloy.

According to this step 501 lower inert metal electrode 103 is also produced. This electrode 103 is, for example, obtained by a method of the damascene type, which consists in etching a VIA, through a resin mask, in a dielectric 115. The VIA is then covered by the metal, and the surplus metal is then removed by chemical mechanical polishing, CMP, to obtain inert electrode 103. Dielectric 115 insulating the VIA may for example be $SiO_2$, deposited on the substrate, which may be between 50 and 100 nm thick. Inert electrode 103 is for example made of Pt, TiN or W.

According to step 502 represented in FIG. 9 a dielectric layer (for example a layer of $Si_3N_4$ which is between 50 nm and 100 nm thick) is deposited. This dielectric layer is then etched after photolithography so as to produce a second cavity 122 surrounded by dielectric portions 117. Width c of cavity 122 is in this case less than that of metal VIA 13; it will however be noted that the dimensions of this second cavity are not critical for implementation of the method.

According to step 503 represented in FIG. 10, a dielectric is deposited in cavity 122. This dielectric is etched (for example by anisotropic etching) so as to produce spacers 107 located on the sides of second cavity 122.

The shape of spacers 107 (and in particular the sides of spacers 107) obtained depends on the etching conditions (known by those skilled in the art), and will subsequently enable the complementary shape of the electrolyte deposited in the dielectric to be defined.

Width t of each of spacers 107 is equal to the width (or thickness) of the deposited dielectric; this width t is chosen relative to width c of second cavity 122 so as to leave a space 123 of width g in second cavity 122 forming an aperture in lower inert metal electrode 103. Dimensions t, c and g are thus chosen so as to have a space 123 with the smallest possible dimension, of the order of several nm: this space 123 defines the contact surface between the electrolyte and the inert electrode. As an example, the following triplet may be used: c=100 nm; t=45 nm; g=10 nm. As mentioned above, the dimension of dielectric 117 may be relaxed: the length of second cavity 122 is not critical and may be of a larger dimension. The dielectric material forming spacers 107 is chosen such that the soluble metal electrode has a low coefficient of diffusion in this dielectric material. These spacers 107 should not, indeed, act as an electrolyte. As an example, in the case of an Ag soluble electrode, spacers 107 made of $SiO_2$ may be chosen.

According to step 504 represented in FIG. 11, solid electrolyte 112 (for example $GeS_2$ (50 nm) or $SiO_2$ (10 nm), etc.) is deposited.

According to step 505 represented in FIG. 12, a chemical mechanical polishing of the upper portion of electrolyte 112 (i.e. the portion located above cavity 123) is undertaken so as to obtain an electrolyte 112 of lesser volume.

According to an unrepresented alternative it is also possible to obtain an aperture such as aperture 123 by not using spacers 107 and by using other methods such as resin creep. According to this latter technique, a layer of dielectric material 117 is retained (FIG. 9) without making aperture 118. A pattern of resin subject to creep is made in the area where the electrolyte is produced. This resin pattern has roughly the same shape as the lower portion of electrolyte 112. This type of pattern may be obtained, notably, by using a resin of the "Deep UV" type which is spread and then lithographed. A fraction of the resin is imaged (for example by UV radiation) through a mask comprising a portion which is transparent to short-wavelength UV radiation (typically of between 150 and 300 nm) and a portion which is opaque to UV radiation (absorbing UV radiation); a latent image is then created, by photochemical reaction, all the way through the photosensitive resin. The resin is then "developed". A final annealing is applied to harden the resin pattern formed in this manner. After these steps of development and annealing, a temperature above the glass transition temperature is applied to make the resin "creep". The shape of the resin pattern is then transferred into the dielectric layer so as to obtain an aperture having roughly the shape of the lower portion of the electrolyte. This transfer is obtained, for example, by undertaking a plasma etching.

According to step 506 represented in FIG. 13 a dielectric layer (for example a layer of $Si_3N_4$ or of $SiO_2$ which is between 50 nm and 100 nm thick) is deposited. This dielectric layer is then etched after photolithography so as to produce a cavity 120 surrounded by dielectric portions 119. Width c' of cavity 120 is in this case less than that of metal VIA 13; it will however be noted that the dimensions of cavity 120 are not critical for implementation of the method.

According to step 507 represented in FIG. 14, a dielectric is deposited in cavity 120. This dielectric is etched (for example by anisotropic etching) so as to produce spacers 118 located on the sides of cavity 120.

The shape of spacers 118 obtained depends on the etching conditions, and will subsequently enable the complementary shape of the soluble electrode deposited in the dielectric to be defined.

Width t' of each of spacers 118 is equal to the width (or thickness) of the deposited dielectric; this width t' is chosen relative to width c' of cavity 120 so as to leave a space 121 of width g' in cavity 120 forming a smaller aperture on the surface of solid electrolyte 112.

Dimensions t', c' and g' are thus chosen so as to have a space 120 with the smallest possible dimension, of the order of several nm: this space 120 defines the contact surface between the soluble electrode and the electrolyte. The dielectric material forming spacers 118 is chosen such that the soluble metal electrode has a low coefficient of diffusion in this dielectric material. These spacers 118 should not, indeed, act as an electrolyte. As an example, in the case of an Ag soluble electrode, spacers 118 made of $Si_3N_4$ may be chosen.

According to step 508 illustrated in FIG. 15, upper soluble electrode 104 is deposited and etched after photolithography (for example a thickness of between 10 nm and 50 nm of Cu or Ag), so as to obtain device 100 as represented in FIG. 4. The point effect produced in this manner in the area of the upper electrode leads to a local increase of the electric field during the SET operation, which enables the filament to be guided and its position to be controlled, and therefore the filament's size and position dispersions to be reduced.

Figure 16:
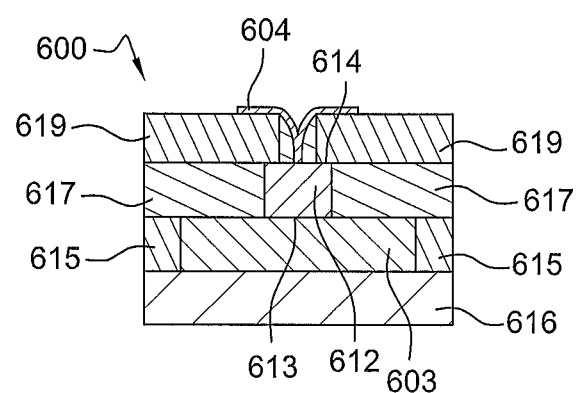
FIG. 16 represents schematically another embodiment of the device according to the invention.

FIG. 16 illustrates another embodiment of a device 600 according to an embodiment of the invention. The difference between device 100 of FIG. 4 and device 600 of FIG. 16 lies in the fact that the electrolyte of device 600 is not confined, and only the soluble electrode is confined.

As with device 100, device 600 comprises a solid electrolyte 612 positioned between an inert lower electrode 603 and an upper electrode 604.

Device 600 is formed by a stack of the Metal/Ionic Conductor/Metal type.

Device 600 comprises a solid electrolyte 612, for example made of doped chalcogenide, such as GeS, positioned between a lower inert electrode 603, for example made of Pt, forming an inert cathode, and an upper electrode 604 comprising a portion of ionisable metal, for example made of Ag, i.e. a portion of metal which is able easily to form metal ions (in this case, Ag+ ions), and forming an anode. This device 600 also comprises lateral dielectric portions 617 positioned around electrolyte 612.

Inert electrode 603 is isolated laterally (for example by dielectric spacers 615) and lies on a metal line 616.

In this case, electrolyte 612 has a standard shape without confinement (i.e. a roughly parallelepipedic shape).

In other words, the volume of electrolyte 612 is symmetrical in this case, and chosen such that contact surface 613 of the electrolyte with inert electrode 603 is roughly equal to available surface 614 of electrolyte 612 located on the side of soluble electrode 604.

In accordance with an embodiment of the invention, soluble electrode 604 is an electrode of which the end in contact with surface 614 of electrolyte 612 is small. In other words, the surface of the end of soluble electrode 604 in contact with electrolyte 612 is less than the total available surface of electrolyte 612, such that a confinement of the contact area of soluble electrode 604 on solid electrolyte 612 is obtained. The sides of soluble electrode 604 are concave and rounded. The shape is given purely illustratively and in no way restrictively.

Device 600 also comprises lateral dielectric portions 618 positioned around soluble electrode 604. These dielectric spacers 618 are themselves surrounded by dielectric portions 619.

Device 600 may be obtained according to a method comparable to the one described with reference to FIGS. 8 to 15, where only the steps relative to the shaping of a confined electrolyte are eliminated.

It will be appreciated that the device and the method according to the invention are not limited to the embodiments which have been described by way of examples and in no way restrictively with reference to FIGS. 1 to 16.

Although the invention has been described illustratively using one filament it is thus understood that the device according to the invention may comprise multiple filaments distributed in the electrolyte.

It will also be noted that the device contains a soluble electrode and an inert electrode, where each of these electrodes may equally be positioned as the upper or lower electrode, where the inert electrode is, in an embodiment, preferably positioned on the side of the narrowest area of the electrolyte, and where the soluble electrode is positioned on the side of the large volume of the solid electrolyte.

The invention claimed is:

1. An electronic device comprising:
a first electrode made of an inert material;
a second electrode made of a soluble material for supplying mobile ions;
a solid electrolyte made of an ion-conductive material, wherein the first and second electrodes are in contact respectively with one of the faces of the electrolyte, either side of said electrolyte, wherein, when a voltage is applied between the first and second electrodes, the second electrode supplies the mobile ions flowing in the electrolyte towards the first electrode, in order to form a conductive filament between the first electrode and the second electrode;
wherein the second electrode made of soluble material is a confinement electrode, wherein said confinement electrode comprises an end surface in contact with the electrolyte which is less than the available surface of the electrolyte, such that confinement of a contact area of said confinement electrode on the solid electrolyte is obtained, and wherein the volume of the electrolyte is chosen such that a surface of a first end of the electrolyte in contact with the first electrode is strictly less than a surface of a second end of the electrolyte opposite the first end.

2. A device according to claim 1, wherein a section of the confinement electrode measured parallel to a contact plane of the electrolyte with the confinement electrode continuously grows from the contact plane over at least part of the height of said confinement electrode.

3. A device according to claim 2, wherein the section of the electrolyte measured parallel to the contact plane of said electrolyte with the first electrode grows continuously from the contact plane over at least part of the height of the electrolyte.

4. A device according to claim 2, wherein the electrolyte has a first portion of constant section in contact with the first electrode followed by a second portion of constant section, wherein the constant section of the first portion is less than the constant section of the second portion, and wherein the constant sections are measured parallel to the contact planes of the electrolyte with the first and second electrodes.

5. A device according to claim 1, comprising an insulator surrounding the electrolyte over at least part of its height.

6. A device according to claim 1, comprising an insulator surrounding the confinement electrode over at least part of its height.

7. A method of manufacture of the device according to claim 6, comprising:
producing an aperture in an insulating material, wherein said aperture has the shape of said confinement electrode;
filling said aperture by a material forming the confinement electrode.

8. A method according to claim 7, wherein said aperture is obtained by anisotropic etching of the insulating material.

9. An electronic device comprising:
a first electrode made of an inert material;
a second electrode made of a soluble material for supplying mobile ions;
a solid electrolyte made of an ion-conductive material and extending from a first end to a second end, opposite the first end, wherein the first end of the solid electrolyte is in contact with the first electrode and the second end of the solid electrolyte is in contact with the second electrode;
wherein a cross-section of the solid electrolyte varies from the first end to the second end so that a surface area of the first end in contact with the first electrode is lower than a surface area of the second end in contact with the second electrode and a surface area of the second electrode that is in contact with the solid electrolyte is lower than the surface area of the second end of the electrolyte, and
wherein the electronic device has a conductive state in which, when a voltage is applied between the first and second electrodes, the second electrode supplies the mobile ions flowing in the electrolyte towards the first electrode to form a conductive filament between the first electrode and the second electrode.

10. A device according to claim 9, wherein the solid electrolyte has a first portion of constant section in contact with the first electrode followed by a second portion of constant section, wherein the constant section of the first portion is less than the constant section of the second portion, and wherein the constant sections are measured parallel to the contact planes of the electrolyte with the first and second electrodes.

11. A device according to claim 9, comprising an insulator surrounding the solid electrolyte over at least part of its height.

12. A device according to claim 9, comprising an insulator surrounding the second electrode over at least part of its height.

13. A device according to claim 9, wherein the solid electrolyte is made of a chalcogenide material, or at least one oxide selected from the group consisting of $SiO_2$, $HfO_2$, $Ta_2O_5$, $TiO_2$, GdOx, CuOx, and WOx, or at least one sulphide selected from the group consisting of $GeS_x$, $Cu_xS$ and AgS.

* * * * *